(12) United States Patent
Cuthbert, II et al.

(10) Patent No.: US 8,779,950 B2
(45) Date of Patent: Jul. 15, 2014

(54) COMMAND ENCODED DATA COMPRESSION

(75) Inventors: Jeffery Lane Cuthbert, II, Happy Valley, OR (US); Joshua Elliott Dreyer, Oregon City, OR (US); Martin C. Abelsen, Oregon City, OR (US)

(73) Assignee: DCBA, LLC, Portland, OR (US)

( * ) Notice: Subject to any disclaimer, the term of this patent is extended or adjusted under 35 U.S.C. 154(b) by 313 days.

(21) Appl. No.: 13/411,961

(22) Filed: Mar. 5, 2012

(65) Prior Publication Data

US 2013/0232305 A1  Sep. 5, 2013

(51) Int. Cl.
*H03M 7/00* (2006.01)

(52) U.S. Cl.
USPC .............................................. 341/50; 341/51

(58) Field of Classification Search
USPC ...................................................... 341/50–51
See application file for complete search history.

(56) References Cited

U.S. PATENT DOCUMENTS

| | | |
|---|---|---|
| 3,914,586 A | 10/1975 | McIntosh |
| 3,976,844 A | 8/1976 | Betz |
| 4,021,782 A | 5/1977 | Hoerning |
| 4,054,951 A | 10/1977 | Jackson et al. |
| 4,087,788 A | 5/1978 | Johannesson |
| 4,122,440 A | 10/1978 | Langdon, Jr. |
| 4,286,256 A | 8/1981 | Langdon, Jr. et al. |
| 4,295,125 A | 10/1981 | Langdon, Jr. |
| 4,366,551 A | 12/1982 | Holtz |
| 4,412,306 A | 10/1983 | Moll |
| 4,463,342 A | 7/1984 | Langdon, Jr. et al. |
| 4,464,650 A | 8/1984 | Eastman et al. |
| 4,467,317 A | 8/1984 | Langdon, Jr. et al. |
| 4,491,934 A | 1/1985 | Heinz |
| 4,494,108 A | 1/1985 | Langdon, Jr. et al. |
| 4,558,302 A | 12/1985 | Welch |
| 4,560,976 A | 12/1985 | Finn |
| 4,586,027 A | 4/1986 | Tsukiyama et al. |
| 4,597,057 A | 6/1986 | Snow |
| 4,612,532 A | 9/1986 | Bacon et al. |
| 4,622,545 A | 11/1986 | Atkinson |
| 4,633,490 A | 12/1986 | Goertzel et al. |
| 4,652,856 A | 3/1987 | Mohiuddin et al. |
| 4,667,649 A | 5/1987 | Humphrey |
| 4,682,150 A | 7/1987 | Mathes et al. |
| 4,701,745 A | 10/1987 | Waterworth |

(Continued)

FOREIGN PATENT DOCUMENTS

| | | |
|---|---|---|
| BE | 904359 A1 | 6/1986 |
| EP | 0129439 A1 | 12/1984 |
| WO | WO2009045133 A1 | 4/2009 |
| WO | WO2011010170 A2 | 1/2011 |

*Primary Examiner* — Khai M Nguyen
(74) *Attorney, Agent, or Firm* — Kolisch Hartwell, P.C.

(57) ABSTRACT

A method implemented in a computer system may include reading a first set of data byte values, providing a reproducible first array that includes at least one of each data byte value in the first set, identifying in the first array a first contiguous pathway that defines a set of data byte values matching the first set, and creating a second set of command byte values representing the first contiguous pathway. The method may further include providing a reproducible second array that includes at least one of each command byte value in the second set, identifying in the second array a second contiguous pathway that defines a set of command byte values matching the second set, and creating a third set of command byte values representing the second contiguous pathway.

21 Claims, 9 Drawing Sheets

(56) References Cited

U.S. PATENT DOCUMENTS

| | | |
|---|---|---|
| 4,730,348 A | 3/1988 | MacCrisken |
| 4,758,899 A | 7/1988 | Tsukiyama |
| 4,792,954 A | 12/1988 | Arps et al. |
| 4,809,350 A | 2/1989 | Shimoni et al. |
| 4,814,746 A | 3/1989 | Miller et al. |
| 4,841,092 A | 6/1989 | Smiley |
| 4,853,696 A | 8/1989 | Mukherjee |
| 4,872,009 A | 10/1989 | Tsukiyama et al. |
| 4,876,541 A | 10/1989 | Storer |
| 4,891,643 A | 1/1990 | Mitchell et al. |
| 4,901,363 A | 2/1990 | Toyokawa |
| 4,905,297 A | 2/1990 | Langdon, Jr. et al. |
| 4,906,991 A | 3/1990 | Fiala et al. |
| 4,933,883 A | 6/1990 | Pennebaker et al. |
| 4,935,882 A | 6/1990 | Pennebaker et al. |
| 4,941,193 A | 7/1990 | Barnsley et al. |
| 4,943,869 A | 7/1990 | Horikawa et al. |
| 4,955,066 A | 9/1990 | Notenboom |
| 4,973,961 A | 11/1990 | Chamzas et al. |
| 4,988,998 A | 1/1991 | O'Brien |
| 4,989,000 A | 1/1991 | Chevion et al. |
| 5,001,478 A | 3/1991 | Nagy |
| 5,003,307 A | 3/1991 | Whiting et al. |
| 5,016,009 A | 5/1991 | Whiting et al. |
| 5,023,611 A | 6/1991 | Chamzas et al. |
| 5,025,258 A | 6/1991 | Duttweiler |
| 5,045,852 A | 9/1991 | Mitchell et al. |
| 5,049,881 A | 9/1991 | Gibson et al. |
| 5,051,745 A | 9/1991 | Katz |
| 5,065,447 A | 11/1991 | Barnsley et al. |
| 5,099,440 A | 3/1992 | Pennebaker et al. |
| 5,109,433 A | 4/1992 | Notenboom |
| 5,126,739 A | 6/1992 | Whiting et al. |
| 5,140,321 A | 8/1992 | Jung |
| 5,142,283 A | 8/1992 | Chevion et al. |
| 5,155,484 A | 10/1992 | Chambers, IV |
| 5,179,378 A | 1/1993 | Ranganathan et al. |
| 5,210,536 A | 5/1993 | Furlan |
| 5,229,768 A | 7/1993 | Thomas |
| 5,272,478 A | 12/1993 | Allen |
| 5,307,062 A | 4/1994 | Ono et al. |
| 5,309,381 A | 5/1994 | Fukui |
| 5,311,177 A | 5/1994 | Kimura et al. |
| 5,347,600 A | 9/1994 | Barnsley et al. |
| 5,363,099 A | 11/1994 | Allen |
| 5,384,867 A | 1/1995 | Barnsley et al. |
| 5,404,140 A | 4/1995 | Ono et al. |
| 5,406,282 A | 4/1995 | Nomizu |
| 5,414,423 A | 5/1995 | Pennebaker |
| 5,416,856 A | 5/1995 | Jacobs et al. |
| 5,418,532 A | 5/1995 | Lei |
| 5,430,812 A | 7/1995 | Barnsley et al. |
| 5,455,577 A | 10/1995 | Slivka et al. |
| 5,533,051 A | 7/1996 | James |
| 5,546,080 A | 8/1996 | Langdon, Jr. et al. |
| 6,597,812 B1 | 7/2003 | Fallon et al. |
| 6,927,706 B2 * | 8/2005 | Horie ............... 341/51 |
| 7,233,266 B2 | 6/2007 | Sasakura |
| 7,693,339 B2 | 4/2010 | Wittenstein |
| 7,907,784 B2 | 3/2011 | Gladkova et al. |
| 8,115,660 B2 * | 2/2012 | Kaufman et al. ......... 341/87 |
| 8,560,552 B2 * | 10/2013 | Fortier ............... 707/747 |
| 2010/0085605 A1 | 4/2010 | Shaw et al. |

\* cited by examiner

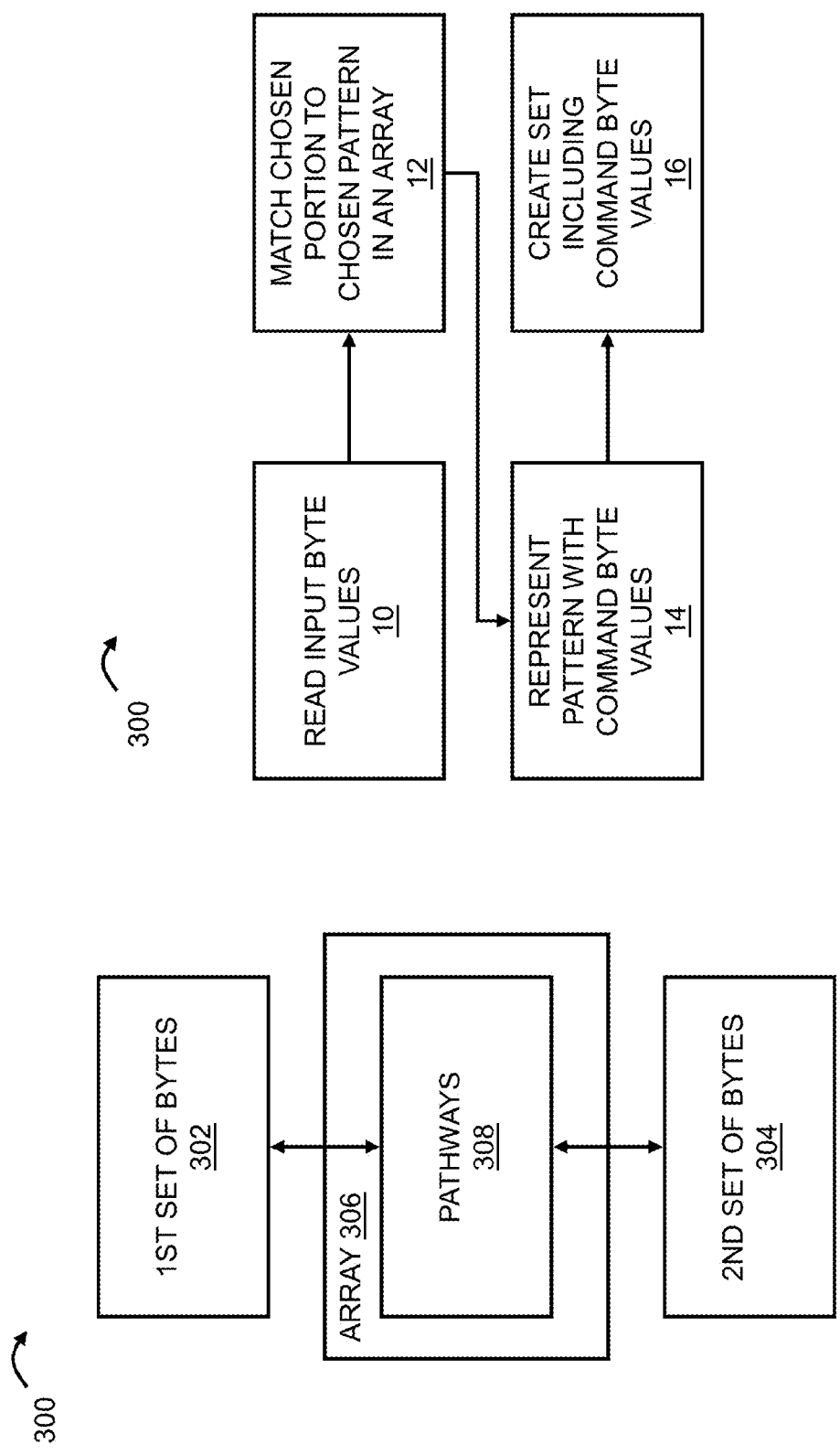

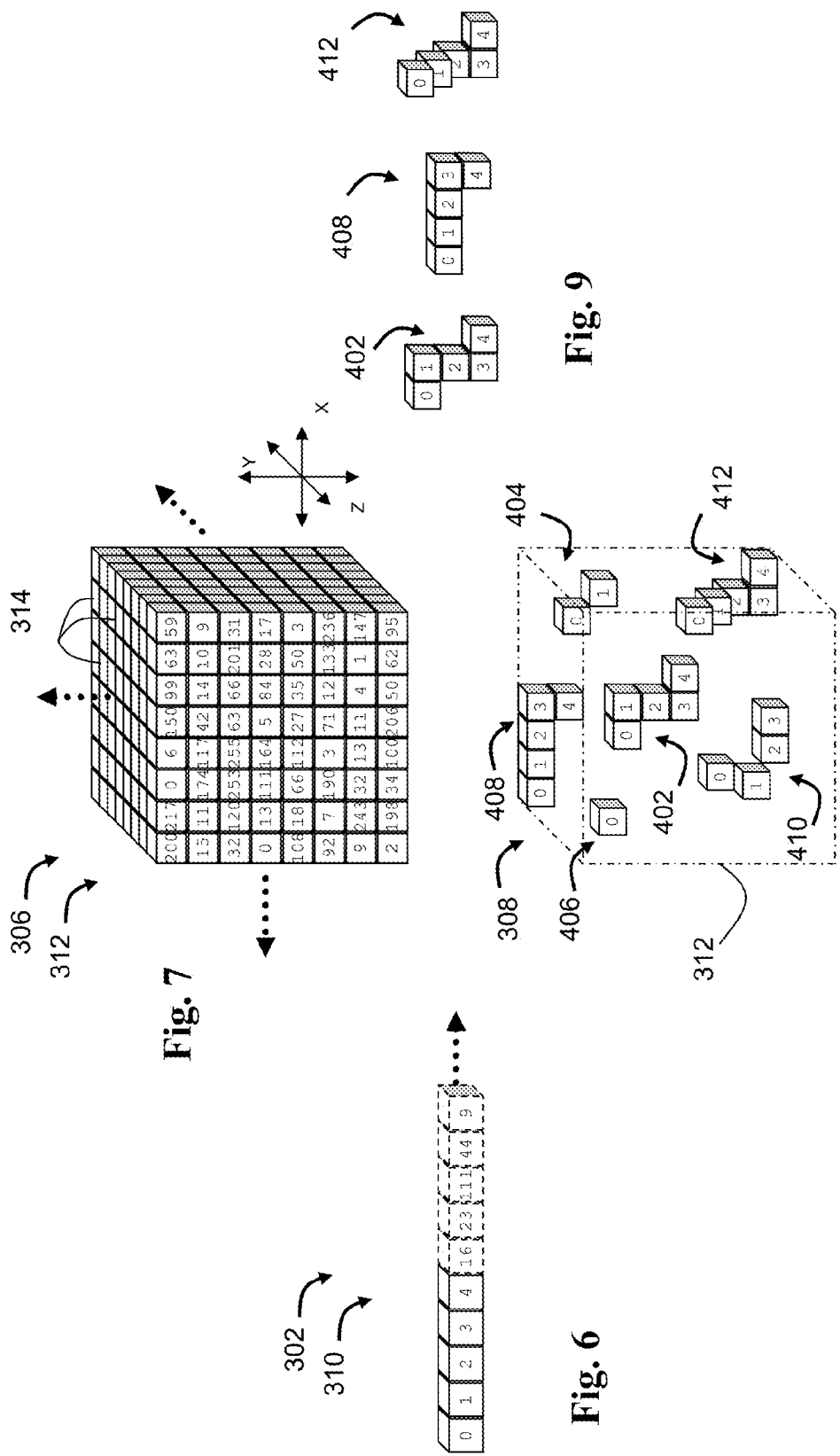

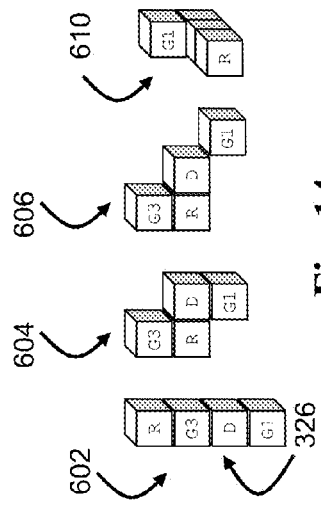
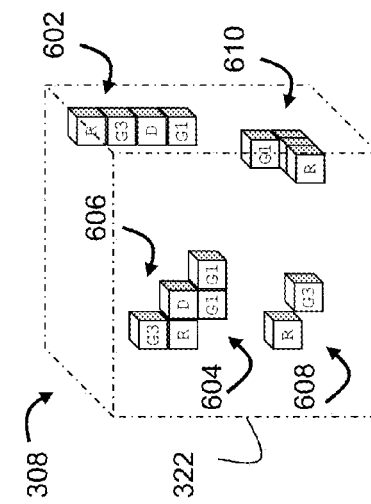
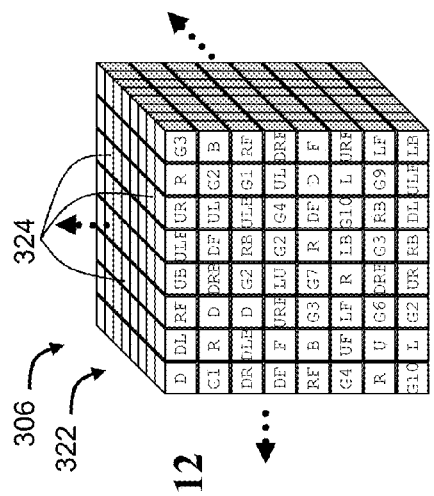
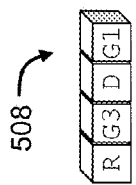
Fig. 14
Fig. 12
Fig. 13
Fig. 11

US 8,779,950 B2

COMMAND ENCODED DATA COMPRESSION

BACKGROUND

The present disclosure relates generally to data compression and encryption. More specifically, the present disclosure relates to methods for compressing data using command encoding.

Computer files may be several megabytes or gigabytes in size, resulting in a need for compression in order to maximize storage on a given storage medium. While the cost of storage media has dropped significantly over time, the ability to compress the files for transfer or transmission remains desirable in order to reduce transmission time and bandwidth usage. As a secondary benefit, this process may serve to encrypt the data to some degree, providing enhanced security.

Data compression methods generally fall into two categories, known as "lossless" and "lossy." Lossless methods of compression generally take advantage of repeated patterns within a file's data. Lossless methods faithfully reproduce every aspect of the data, but reduce overall size by replacing repetitive portions with smaller representative codes.

Lossy methods, on the other hand, generally change the data slightly, for example by homogenizing portions that have only slight variations. This in turn makes the data more amenable to compression by creating repeated patterns where before there were none. For example, a digital photograph of an outdoor scene may have hundreds of shades of blue in the sky portion of the photo. A lossy method may convert all of the blues into a single shade and therefore be able to encode the entire sky portion with a single data point. As the name lossy implies, some data is inevitably lost in translation (as in the photo, which when later decompressed will only have a single shade of blue in the sky where before there were many).

SUMMARY

One or more embodiments of the present invention may include methods, systems, and computer program products for command encoded data compression. According to an embodiment of the present disclosure, a method implemented in a computer system may include reading a first set of data byte values, providing a reproducible first array that includes at least one of each data byte value in the first set, identifying in the first array a first contiguous pathway that defines a set of data byte values matching the first set, and creating a second set of command byte values representing the first contiguous pathway. The method may further include providing a reproducible second array that includes at least one of each command byte value in the second set, identifying in the second array a second contiguous pathway that defines a set of command byte values matching the second set, and creating a third set of command byte values representing the second contiguous pathway.

According to an embodiment of the present disclosure, a computer system for manipulating data may include a processor, a memory, and a data manipulation program. The program may include a plurality of instructions stored in the memory that are executed by the processor to read a first set of input byte values, and to match a chosen first portion of the first set of input byte values to a chosen first pattern found in a first reproducible array of byte values. The program may also include instructions to represent the first pattern using corresponding first command byte values indicating one or more commands to recreate the first pattern. The program may also include instructions to create a second set of byte values including the command byte values that represent the first pattern. The first portion and first pattern may be chosen from respective multiple candidate portions and patterns based on preselected criteria biased toward candidate portions having a greater size and candidate patterns having a smaller corresponding set of command byte values.

According to an embodiment of the present disclosure, a computer program product for manipulating data may include a computer-readable storage medium having computer-readable program code embodied therewith. The computer readable program code may be configured to losslessly translate between a first set of bytes and a plurality of pathways in a reproducible array of byte values, and losslessly translate between the plurality of pathways in the reproducible array of byte values and a second set of bytes. Each byte in the first set may have a first number of possible values, each byte in the second set may have a second number of possible values, and the first number may be less than or equal to the second number.

BRIEF DESCRIPTION OF THE DRAWINGS

In order that the present disclosure will be readily understood, a more particular description will be rendered by reference to specific embodiments that are illustrated in the appended drawings. Understanding that these drawings depict only typical embodiments of the invention and are not therefore to be considered to be limiting of its scope, methods and systems will be described and explained with additional specificity and detail through the use of the accompanying drawings, in which:

FIG. 3 is a diagram depicting an illustrative method of command encoded lossless data compression.

FIG. 4 is a flow chart depicting an illustrative method of command encoded lossless data compression.

FIG. 6 depicts an example of a set of input bytes.

FIG. 7 depicts an example of a first array.

FIG. 8 depicts examples of pathways in the array of FIG. 7.

FIG. 9 depicts examples of selected pathways from those shown in FIG. 8.

FIG. 11 depicts an example of a chosen command representation.

FIG. 12 depicts an example of a second array.

FIG. 13 depicts examples of pathways in the array of FIG. 12.

FIG. 14 depicts examples of selected pathways from those shown in FIG. 13.

DETAILED DESCRIPTION

Figure 1:
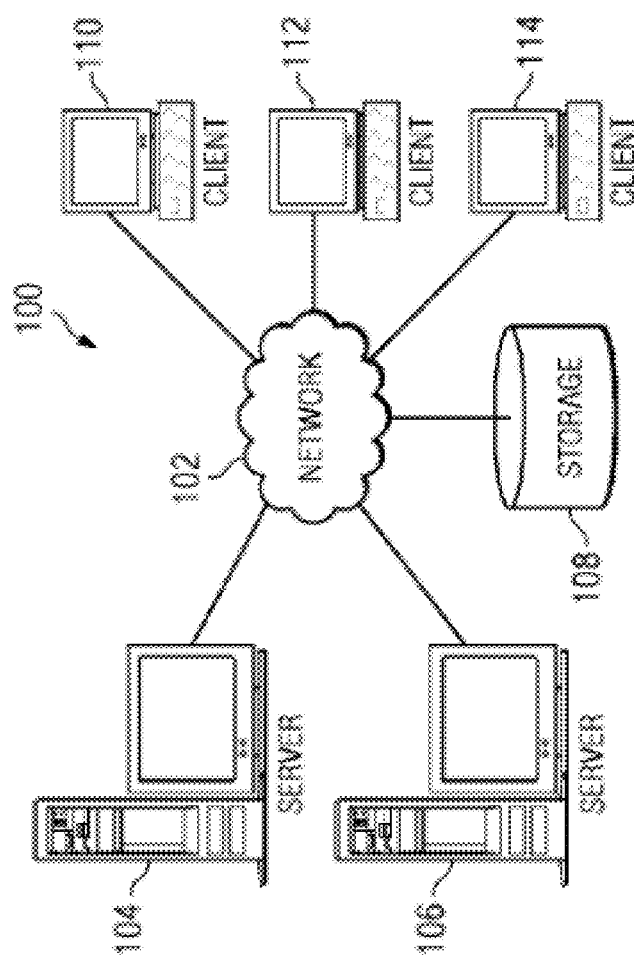
FIG. 1 is a pictorial representation of a distributed data processing system in which illustrative embodiments may be implemented.

Lossless data compression and encryption may be accomplished by matching portions of the data to patterns found within reproducible arrays containing byte values. Identified patterns may be encoded as commands for recreating the patterns. Strings of these commands may be encoded in similar fashion using other reproducible arrays containing only command values. The resulting information may be used to recreate the original data, but may be significantly reduced in size from the original data set.

As will be appreciated by one skilled in the art, the present disclosure may be embodied as a system, method, or computer program product. Accordingly, the disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the disclosure may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples of a computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device.

Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of the present disclosure, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, or RF.

Computer program code for carrying out operations of the embodiments of the disclosure may be written in any combination of one or more programming languages, including an object oriented programming language such as Java, Smalltalk, C++ or the like and conventional procedural programming languages, such as the C programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The aspects of the disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

With reference now to the figures and in particular with reference to FIG. 1, an illustrative diagram of a data processing environment is provided in which illustrative embodiments may be implemented. It should be appreciated that FIG. 1 is only provided as an illustration of one implementation and is not intended to imply any limitation with regard to the environments in which different embodiments may be implemented. Many modifications to the depicted environments may be made.

FIG. 1 depicts a pictorial representation of a distributed data processing systems in which illustrative embodiments may be implemented. Network data processing system 100 is a network of computers in which the illustrative embodiments may be implemented. Network data processing system 100 contains network 102, which is the medium used to provide communications links between various devices and computers connected together within network data processing system 100. Network 102 may include connections, such as wire, wireless communication links, or fiber optic cables.

In the depicted example, server computer 104 and server computer 106 connect to network 102 along with storage unit 108. In addition, client computers 110, 112, and 114 connect to network 102. Client computers 110, 112, and 114 may be, for example, personal computers, network computers, or mobile computing devices such as personal digital assistants (PDAs), cell phones, handheld gaming devices, or tablet computers and the like. In the depicted example, server computer 104 provides information, such as boot files, operating system images, and applications to client computers 110, 112, and 114. Client computers 110, 112, and 114 are clients to server computer 104 in this example. Network data processing system 100 may include additional server computers, client computers, and other devices not shown.

Program code located in network data processing system 100 may be stored on a computer recordable storage medium and downloaded to a data processing system or other device for use. For example, program code may be stored on a computer recordable storage medium on server computer 104 and downloaded to client computer 110 over network 102 for use on client computer 110.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Network data processing system 100 also may be implemented as a number of different types of networks, such as for example, an intranet, a local area network (LAN), or a wide area network (WAN). FIG. 1 is intended as an example, and not as an architectural limitation for the different illustrative embodiments.

Figure 2:
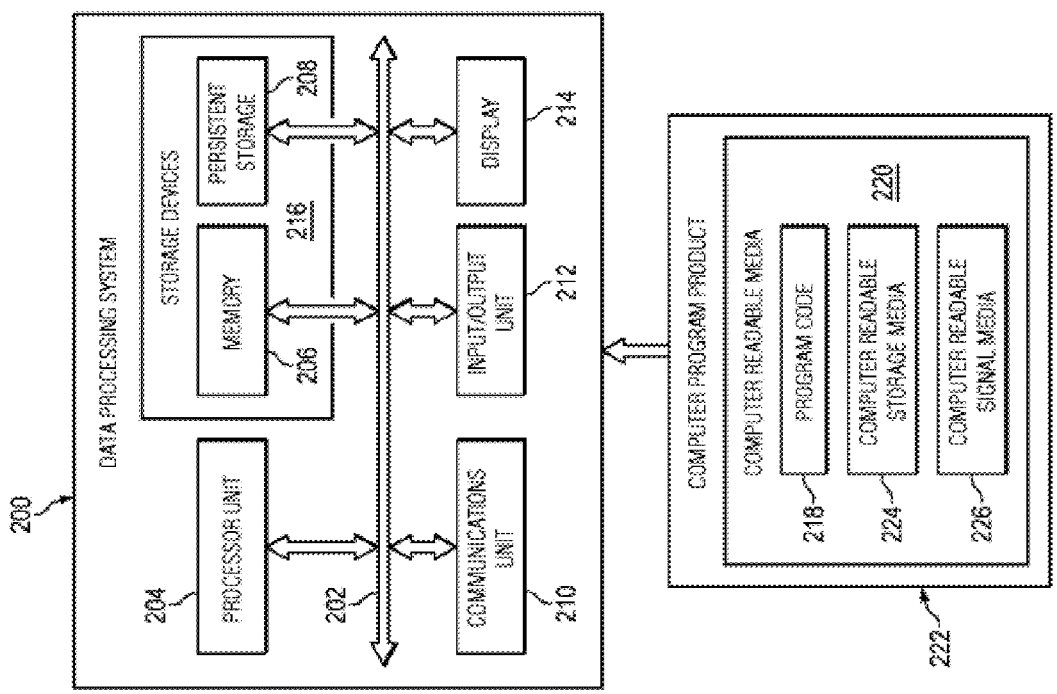
FIG. 2 is a block diagram of a data processing system in which illustrative embodiments may be implemented.

Turning now to FIG. 2, a block diagram of a data processing system is depicted in accordance with the present disclosure. In this illustrative example, data processing system 200 includes communications fabric 202, which provides communications between processor unit 204, memory 206, persistent storage 208, communications unit 210, input/output (I/O) unit 212, and display 214.

Processor unit 204 serves to execute instructions for software that may be loaded into memory 206. Processor unit 204 may be a number of processors, a multi-processor core, or some other type of processor, depending on the particular implementation. A number, as used herein with reference to an item, means one or more items. Further, processor unit 204 may be implemented using a number of heterogeneous processor systems in which a main processor is present with secondary processors on a single chip. As another illustrative example, processor unit 204 may be a symmetric multi-processor system containing multiple processors of the same type.

Memory 206 and persistent storage 208 are examples of storage devices 216. A storage device is any piece of hardware that is capable of storing information, such as, for example, without limitation, data, program code in functional form, and/or other suitable information on either a temporary basis and/or a permanent basis. Memory 206, in these examples, may be, for example, a random access memory or any other suitable volatile or non-volatile storage device. Persistent storage 208 may take various forms, depending on the particular implementation.

For example, persistent storage 208 may contain one or more components or devices such as a hard drive, a flash memory, a rewritable optical disk, a rewritable magnetic tape, or some combination of the above. The media used by persistent storage 208 also may be removable. For example, a removable hard drive may be used for persistent storage 208.

Communications unit 210, in these examples, provides for communications with other data processing systems or devices. In these examples, communications unit 210 may be a network interface card. Communications unit 210 may provide communications through the use of either or both physical and wireless communications links.

Input/output unit 212 allows for input and output of data with other devices that may be connected to data processing system 200. For example, input/output unit 212 may provide a connection for user input through a keyboard, a mouse, and/or some other suitable input device. Further, input/output unit 212 may send output to a printer. Display 214 provides a mechanism to display information to a user.

Instructions for the operating system, applications, and/or programs may be located in storage devices 216, which are in communication with processor unit 204 through communications fabric 202. In these illustrative examples, the instructions are in a functional form on persistent storage 208. These instructions may be loaded into memory 206 for execution by processor unit 204. The processes of the different embodiments may be performed by processor unit 204 using computer implemented instructions, which may be located in a memory, such as memory 206.

These instructions are referred to as program code, computer usable program code, or computer readable program code that may be read and executed by a processor in processor unit 204. The program code in the different embodiments may be embodied on different physical or computer readable storage media, such as memory 206 or persistent storage 208.

Program code 218 is located in a functional form on computer readable media 220 that is selectively removable and may be loaded onto or transferred to data processing system 200 for execution by processor unit 204. Program code 218 and computer readable media 220 form computer program product 222 in these examples. In one example, computer readable media 220 may be computer readable storage media 224 or computer readable signal media 226. Computer readable storage media 224 may include, for example, an optical or magnetic disk that is inserted or placed into a drive or other device that is part of persistent storage 208 for transfer onto a storage device, such as a hard drive, that is part of persistent storage 208. Computer readable storage media 224 also may take the form of a persistent storage, such as a hard drive, a thumb drive, or a flash memory, that is connected to data processing system 200. In some instances, computer readable storage media 224 may not be removable from data processing system 200. In these illustrative examples, computer readable storage media 224 is a non-transitory computer readable storage medium.

Alternatively, program code 218 may be transferred to data processing system 200 using computer readable signal media 226, Computer readable signal media 226 may be, for example, a propagated data signal containing program code 218. For example, computer readable signal media 226 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical and/or wireless in the illustrative examples.

In some embodiments, program code 218 may be downloaded over a network to persistent storage 208 from another device or data processing system through computer readable signal media 226 for use within data processing system 200. For instance, program code stored in a computer readable storage medium in a server data processing system may be downloaded over a network from the server to data processing system 200. The data processing system providing program code 218 may be a server computer, a client computer, or some other device capable of storing and transmitting program code 218.

The different components illustrated for data processing system 200 are not meant to provide architectural limitations to the manner in which different embodiments may be implemented. The different advantageous embodiments may be implemented in a data processing system including components in addition to or in place of those illustrated for data processing system 200. Other components shown in FIG. 2 can be varied from the illustrative examples shown. The different embodiments may be implemented using any hardware device or system capable of running program code. As one example, the data processing system may include organic components integrated with inorganic components and/or may be comprised entirely of organic components excluding a human being. For example, a storage device may be comprised of an organic semiconductor.

As another example, a storage device in data processing system 200 may be any hardware apparatus that may store data. Memory 206, persistent storage 208, and computer readable media 220 are examples of storage devices in a tangible form.

In another example, a bus system may be used to implement communications fabric 202 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 206, or a cache such as found in an interface and memory controller hub that may be present in communications fabric 202.

It is understood that all or part of the system(s) and/or method(s) of the present disclosure may be implemented and/or utilized in a cloud computing environment.

Figure 5:
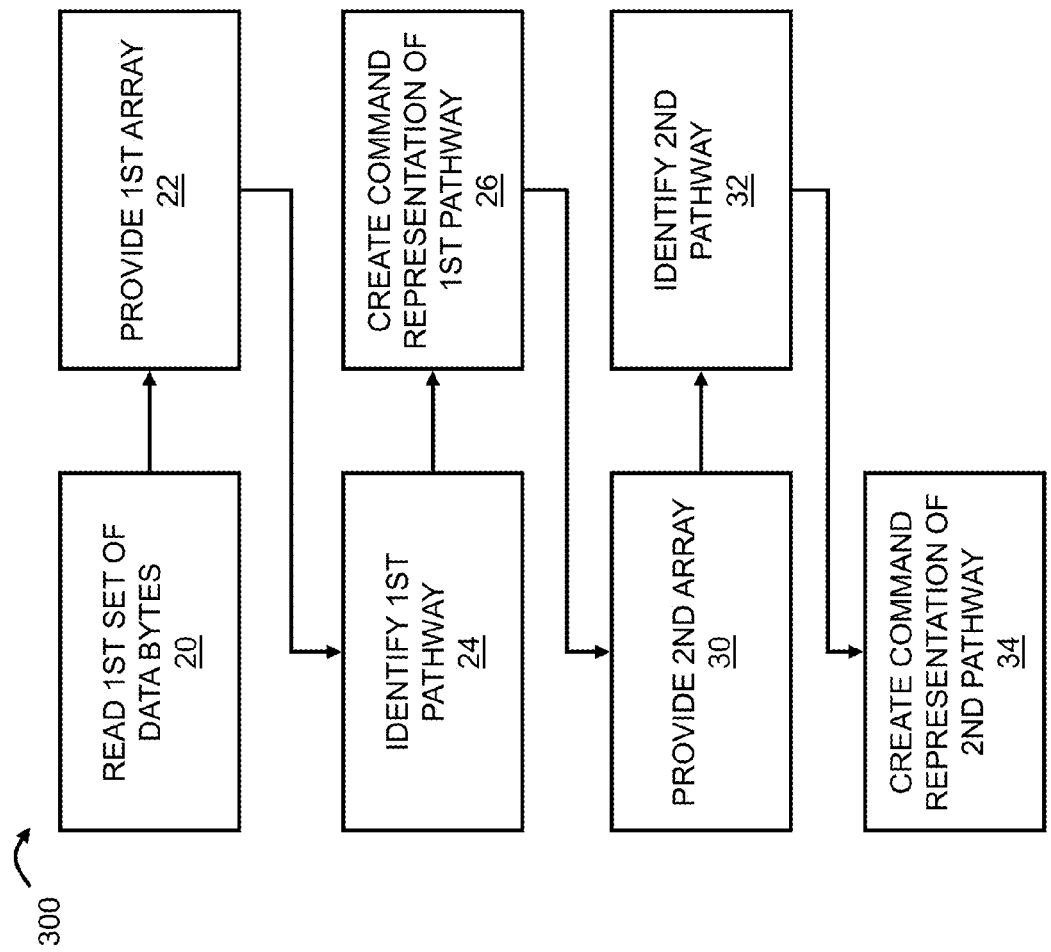
FIG. 5 is a diagram depicting another illustrative method of command encoded lossless data compression.

A command-encoded data compression method is shown generally at 300 in FIGS. 3-5. Unless otherwise specified, command-encoded data compression method 300 may, but is not required to, contain at least one of the structure, components, functionality, steps, and/or variations described, illustrated, and/or incorporated herein. As shown in FIG. 3, compression method 300 may include translation between a first set of bytes 302, one or more patterns or pathways 308 within an array 306, and a second set of bytes 304. Translation between first set of bytes 302 and second set of bytes 304 via pathways 308 may be performed for various purposes, including data encryption or decryption and/or data compression or decompression.

In some embodiments, first set of bytes 302 may be any set of bytes provided as an input to method 300. For example, first set of bytes 302 may include a series of bytes encoding a digital word processing document or digital image. Second set of bytes 304 may be any series of bytes representing instructions for creating pathways 308 in array 306. In some embodiments, the roles of first set of bytes 302 and second set of bytes 304 may be reversed, with second set of bytes 304 acting as an input.

Each of the first and second sets of bytes 302 and 304 may include bytes having a plurality of possible byte values. Bytes may be any group of binary digits that is operated on as a unit by a device such as a processor. For example, a byte may be a group consisting of eight binary digits, or bits. Byte values may be any of the numerical values associated with a byte. For example, by definition an unconstrained eight-bit byte would have 256 possible values ranging in decimal notation from 0 to 255.

In some embodiments, the universe of possible byte values for a given byte size may be artificially limited. For example, in some steps, method 300 may utilize eight-bit bytes but allow only a predetermined number of byte values smaller than the overall 256 possible. In other steps, eight-bit bytes may not be constrained at all. In any given step, this description will refer to the maximum allowable range of byte values as the "possible" values, intending the term possible to mean permissible in that step of the method. Accordingly, each byte in first set of bytes 302 may have a different number of possible values than each byte in second set of bytes 304.

Array 306 may be any suitable array of nodes configured to hold byte values, where a node is a location within the array that is addressable using coordinates. Array 306 may have one or more dimensions. For example, array 306 may be a cube having three dimensions, which will be referred to as X, Y, and Z dimensions. In a three-dimensional array 306, therefore, the location of any given point or node in the array can be described using its X, Y, and Z coordinates. Array 306 may have more or fewer dimensions. In some embodiments, array 306 is four-dimensional. Array 306 may also be described as having a size. In this context, the size of an array may be delineated by the magnitude of each dimension. For example, array 306 may be a three dimensional cube of size 36 by 36 by 36.

Because the nodes of array 306 may be populated with the same range of values as are possible in first set of bytes 302, a given subset of first set of bytes 302 may be matched by finding patterns of corresponding byte values within array 306. For example, a certain series of byte values from first set of bytes 302 may have an equivalent series of values located along a pattern consisting of a contiguous pathway 308 of nodes within array 306. In this example, in other words, sequentially traversing a certain pathway 308 may result in encountering the same byte values as are in the original series from first set of bytes 302. In this context, a contiguous pathway may be meant as a series of nodes wherein any given sequential pair of nodes is contiguous. The term contiguous is used in the sense that within array 306, each of two nodes may touch the other. More specifically, for a three-dimensional array, two nodes may be considered contiguous if each of the respective X, Y, and Z coordinates of one node differs by no more than one unit from the X, Y, and Z coordinates of a second node.

Using the method described above, translating is possible from the first set of bytes 302 to the pathways 308, by finding matching pathways. Translating is also possible from the pathways 308 to the first set of bytes 302 by determining the series of byte values encountered as the pathways are retraced.

Second set of bytes 304 may hold byte values that represent instructions or commands that describe how to create pathways 308. Accordingly, translating is possible from second set of bytes 304 to pathways 308, by implementing the commands. Translating is also possible from pathways 308 to second set of bytes 304, by selecting predefined commands that correspond to the pathways. Combining this methodology with the previous methodology may facilitate encryption, because the byte values in first set of bytes 302 may thus be transformed into representative, but different byte values in second set of bytes 304. It may also facilitate compression, because second set of bytes 304 may be smaller than first set of bytes 302, as explained in more detail below.

FIG. 4 illustrates an embodiment of method 300. In step 10, input byte values may be read by a processor. Input byte values may be part of an input file or digital data stream. Reading may be done by any suitable method. In step 12, a chosen portion of the input byte values may be matched to a chosen pattern in an array. A pattern may include contiguous pathways, as described above. A pattern may also include other pattern-like arrangements such as a geometrical pattern or a non-contiguous pathway. A portion of the input byte values may be any subset of input. For example, a portion may be the first byte value of the set, or may be a series of bytes or a subset of bytes chosen based on certain properties. In some embodiments, a portion of the input byte values and a pattern in the array may be chosen in concert based on certain predetermined criteria.

In step 14 the pattern or patterns matched in step 12 may be represented by command byte values that themselves represent instructions for recreating the patterns. In some embodiments, criteria for choosing a portion and pattern in step 12 may include the relative sizes of command byte value representations of various candidate patterns.

In step 16, a set of bytes may be created by the processor to include the command byte values determined in step 14. The set of bytes may also include byte values representing other information such as an identifier for the set of input values. For example, header information for a digital data file may be included.

FIGS. 5-15 illustrate an embodiment of a two-phase process implementing command-encoded data compression method 300. In some embodiments, Phase One may include steps 20-26 and Phase Two may include steps 30-34.

Referring to FIG. 5, step 20 may include reading a set of data bytes. The data bytes may be any set of digital information arranged in byte form. For example, the data bytes may be a series of eight-bit bytes representing a digital data file or input stream such as a digital photograph or video. Accordingly, byte values associated with the data bytes may be unrestricted, and the number of possible values will be whatever is mathematically possible. For example, with an eight-bit byte architecture, the data bytes may have 256 possible byte values. FIG. 6 depicts an illustrative example of a set of data bytes 310, shown as a string of bytes, each byte having a value from 0 to 255.

Again referring to FIG. 5, in step 22, a first reproducible array may be provided. The first reproducible array is an example of array 306, and may be a digital array having one or more dimensions, with nodes populated by byte values. The first reproducible array may be reproducible based on predetermined criteria. For example, the first reproducible array may be a three-dimensional array having X, Y, and Z coordinates that may be used to identify nodes of the array. Each node may be configured as a storage location for a byte value, or as a pointer to a storage location for a byte value. Each node of the first reproducible array may be populated with a value from 0 to 255. The first reproducible array may be sized sufficiently to include each possible byte value in at least one node. The first reproducible array may be sized to allow more than one occurrence of any given byte value.

FIG. 7 shows an example of a first reproducible array 312, which is depicted as a three-dimensional cube of data, having nodes 314, with X, Y, and Z dimensions illustrated. Array 312 may be configured to be reproducible by providing a predetermined method of construction that will always result in the same values in the same node 314 locations in the same sized array 312. For example, array 312 may be provided by constructing a three dimensional array of a certain size, populating the array by sequentially loading each node 314 with sequential values from 0 to 255, repeating the order as needed to fill the array. Values in nodes 314 of array 312 may then be shuffled or rearranged in a predetermined manner to allow for a more random distribution of the values.

In some embodiments, the first reproducible array may be loaded using a pseudorandom number generating algorithm to produce a set of values from 0 to 255. Any suitable pseudorandom number generating algorithm known in the art would be adequate for this purpose. Generally, the algorithm of a pseudorandom number generator may use a seed value or values to produce an approximation of a random set of numbers. These algorithms do not produce truly random numbers, because the values are entirely determined by the algorithm and the seed value(s). Accordingly, the first reproducible array may be made reproducible by generating a pseudorandom set each time using an identical seed value.

The frequency distribution of byte values in the first reproducible array may be tailored to substantially correspond to a frequency distribution of byte values in the set of data bytes (such as data bytes 310). For example, if certain values occur more or less frequently in the source data, those values may be made to occur more or less frequently in the array. This would be done to increase the probability of finding sequences or patterns of byte values in the first reproducible array that match portions of the set of data bytes. Frequency distribution tailoring may be done either before or after the first reproducible array is populated with values. For example, a loading-then-shuffling method may be conducive to a predetermined frequency distribution of the values being loaded. However, a pseudorandom number generation method may be less conducive to predetermining the distribution, and a post hoc adjustment may be more useful. In some embodiments, this frequency distribution may not be known or may not be sufficiently beneficial to the process to warrant changing the distribution in the first reproducible array.

Again referring to FIG. 5, step 24 may include identifying a first pattern or pathway in the first reproducible array (such as array 312). The first pathway may be an example of a pathway 308, and may be any suitable pattern of locations within the first reproducible array that, if traversed in a predetermined order, will produce a series of values equivalent to the series of values in a subset of data bytes (such as data bytes 310). For example, the first pathway may be an example of a contiguous pathway as described above, in which each subsequent node of the first reproducible array in the first pathway has coordinates that differ by no more than one unit for any given dimension relative to the preceding node. In some embodiments, the first pathway may be a geometric pattern or may be based on a predetermined mathematical formula. The first pathway may be identified by any suitable method. For example, several candidate pathways may be found within the first reproducible array, and a single best or adequate pathway may be chosen from among the candidates. In some embodiments, candidate pathways may continue to be found until one meets certain fitness criteria.

Each candidate pathway may be found by first finding a node of the first reproducible array that contains the first value in the set of data bytes. Continuing with the example of FIGS. 6-9, the first value in bytes 310 is 0. Accordingly, some or all of nodes 314 containing the value 0 may be located. Each node 314 containing 0 may then be examined to determine if any contiguous neighbors contain the second value in the set of data bytes 310. Here, that value is 1. Any nodes 314 thus found containing the value 1 may then be examined for neighbors with the third value, 2, and so on. The process may be repeated until no contiguous neighbor can be found containing the next value in the set of data bytes 310. The result of this candidate-pathway identification process may be to identify several candidate pathways of varying lengths and locations. FIG. 8 depicts an example in which six candidate pathways are found, labeled as 402, 404, 406, 408, 410, and 412.

With multiple candidate pathways, a single first pathway 316 may be identified by comparing the candidates based on predetermined criteria. Multiple criteria may be used. In some embodiments, one criterion may be the overall length or size of each candidate pathway, where size is defined by the number of contiguous nodes in each pathway. In the example of FIG. 8, candidate pathways 402, 408, and 412 would have length 5, while candidate pathway 404 would have length 2, candidate pathway 406 would have length 1, and candidate pathway 410 would have length 4. Typically, candidate pathways having a greater size would be preferred, because greater sizes of pathways are more likely to produce better data compression in subsequent steps. However, this is not always the case.

Returning to FIG. 5, in step 26, a command representation of the first pathway may be created. In some embodiments, this step may be at least partly in parallel with step 24, in that a command representation may be created for one or more candidate pathways found in step 24 before a single candidate is chosen as the first pathway. Characteristics of the resulting command representations may be used as criteria in selecting a single first pathway from among the candidates.

The command representation may be any suitable arrangement of byte values corresponding to predetermined instructions or commands for recreating a pattern or pathway in an array 306 such as the first reproducible array (such as array 312).

For example, a command representation 318 may correspond to a string of predetermined instructions or commands 320. Commands 320 may include "move" and "grab" commands. So-called move commands may include instructions regarding a direction in which the next node or nodes 314 in the pathway or pattern may be found. So-called grab commands may include instructions regarding how many nodes 314 in that direction should be traversed. In some embodiments, there may be 26 move commands corresponding to the 26 possible directions when starting from a given node 314 in array 312. More specifically, for any given node 314 in array 312, the 26 possible directions for reaching a contiguous neighbor may be described as follows:

| Direction | Abbreviation |
|---|---|
| Left Front | LF |
| Left | L |
| Left Back | LB |
| Front | F |
| Back | B |
| Right Front | RF |
| Right | R |
| Right Back | RB |
| Up Left Front | ULF |
| Up Left | UL |
| Up Left Back | ULB |
| Up Front | UF |
| Up Back | UB |
| Up Right Front | URF |
| Up Right | UR |
| Up Right Back | URB |
| Up | U |
| Down Left Front | DLF |
| Down Left | DL |
| Down Left Back | DLB |
| Down Front | DF |
| Down Back | DB |
| Down Right Front | DRF |
| Down Right | DR |
| Down Right Back | DRB |
| Down | D |

In some embodiments, 26 possible directions may be defined even for nodes on an "edge" of the array. This may be done by causing a direction to be interpreted as wrapping around to the opposite edge of the array. In other words, if a maximum limit is reached for any given dimension, the dimension will wrap around to the minimum value, and vice versa. For a dimension of size 36, this means that contiguous neighbors of the node at 35 may be defined as including the nodes at 34 and 0, while contiguous neighbors of the node at 0 may be defined as including the nodes at 35 and 1.

The quantity and/or values of grab commands may be limited based on expected patterns. For example, there may be ten grab commands abbreviated here as G1-G10, corresponding to instructions for traversing from 1 to 10 nodes in a given direction. More or fewer grab commands may be chosen based on a typical range of grab-like operations experienced for a given type of input data. Grab commands may include a non-continuous range of values. For example, there may be five grab commands such as G1, G2, G3, G5, and G10. Based on the previous example with G1-G10, however, 26 move commands and 10 grab commands correspond to a total of 36 possible commands. Accordingly, regardless of the byte size used, only 36 total values may be required and/or allowed to represent these 36 possible commands. In some embodiments, more or fewer commands may be used, corresponding to the type of pattern being recreated.

Figure 10:
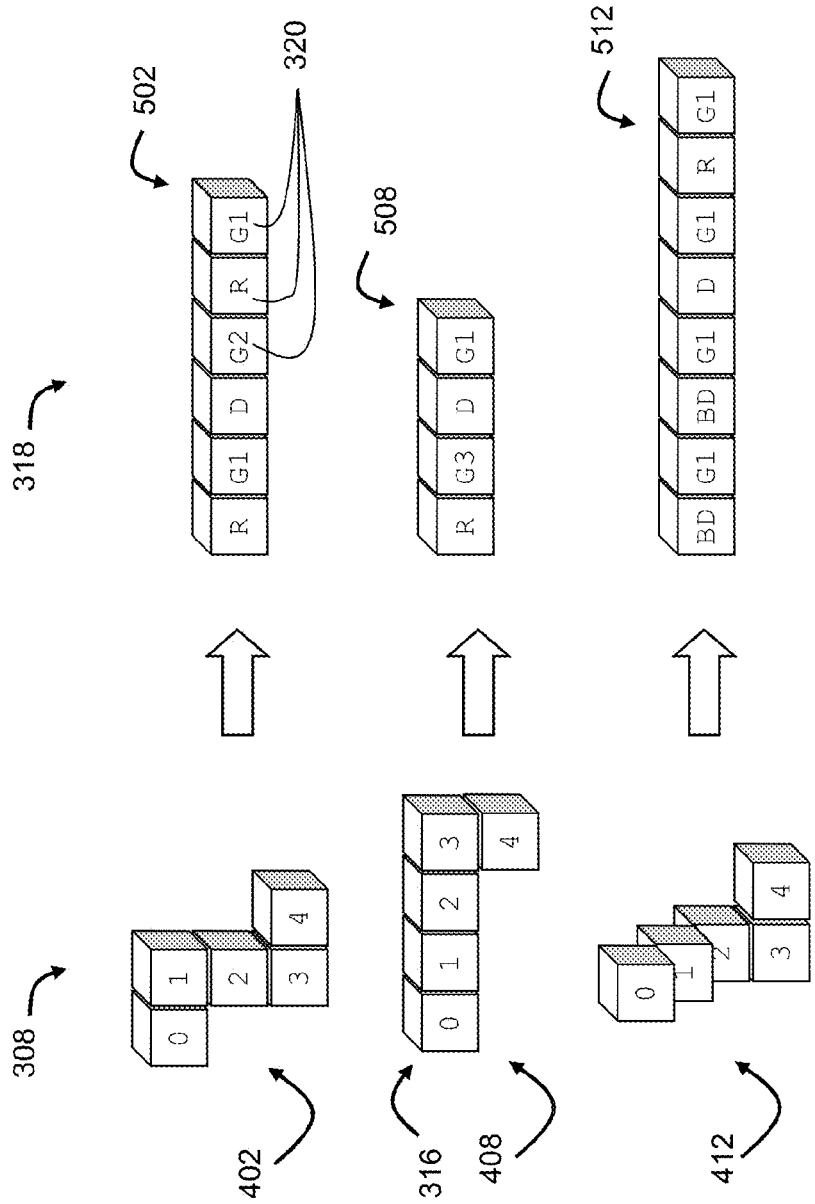
FIG. 10 depicts illustrative command representations of the examples in FIG. 9.

Continuing with the example of FIGS. 6-9, FIG. 9 illustrates how the number of candidate pathways identified in FIG. 8 may be narrowed based on overall size. In this example, three of the candidate pathways had a length of 5. As the greatest length among the candidates, these may be the only candidates further analyzed to choose a single best pathway 316. Analysis may include creating a command representation 318 for each of the candidate pathways 402, 408, and 412. FIG. 10 shows possible command representations, respectively labeled 502, 508, and 512.

In addition to move and grab commands, a command representation 318 may also include a starting location for each pathway. A starting location may be identified by any suitable means. For example, a starting location may be identified as X, Y, and Z coordinates of the first node of a pathway. In some embodiments, a starting location of a pathway may be identified as a relative direction and distance from the final node of a preceding pathway. Using absolute coordinates may be preferable, because it creates data of a fixed size, whereas other methods such as using relative coordinates may create data that varies in size based on the direction or distance to the next starting node. If an absolute method of identifying a starting location is used, it may be disregarded for purposes of choosing from among candidate pathways, and is therefore not illustrated in the drawings.

As depicted in FIG. 10, each candidate pathway may be represented using move and grab commands. For example, candidate pathway 402 may be represented as follows. First, the node containing 0 may be identified by its X, Y, and Z coordinates, which are the starting location for this pathway. Next, the node containing 1 may be reached from the first node by going right. Accordingly, the first command code may be R. In this example, the node containing 2 is found by then moving down. Because no further nodes are found in the R direction, the G1 command to grab one node (the one containing 1) may be used, and the next command would be D to go down. However, nodes containing both 2 and 3 are found in the down direction, so this time the G2 command to grab two nodes may be used. The final node in this path is then found to the right of the one containing 3. Accordingly, the commands R for "right," and G1 for "grab one" may be added to the command representation string, resulting in a final representation as shown at 502. The other candidate pathways shown in FIG. 10, as well as candidate pathways in other drawings, are encoded in similar fashion.

As shown in FIG. 10, candidate pathway 408 may be represented by the shortest command representation, here command representation 508, which has a size of four. As the candidate pathway with the longest size and the shortest corresponding command representation, candidate pathway 408 may be chosen as first pathway 316. Command representation 508 representing pathway 316 is illustrated in FIG. 11. One skilled in the art will appreciate that analysis of slightly shorter candidate pathways may in some cases result in significantly shorter command representations. Accordingly, candidates other than those having the absolute largest size may be analyzed to determine the optimum combination of pathway length and command representation size, with an overall goal of data compression.

One skilled in the art will also recognize that the commands and representations described here are merely examples. Moreover, the commands are described colloquially while actual command codes may consist of numerical values that may be interpreted appropriately by a processor to accomplish the desired result. Any suitable commands describing how to recreate a pattern or pathway may be used, as long as those commands can be digitally represented and interpreted. Different words or abbreviations may be used to represent directions or distances. In some embodiments, directions and distances may be combined. In some embodiments, coordinates may be used for more than starting locations. Many combinations and alternatives are possible while still remaining within the scope of the present disclosure.

Referring again to FIG. 5, step 30 may include providing a second reproducible array and may represent entering Phase Two of method 300. In this phase, steps similar to previous steps may be repeated to facilitate encryption and further data compression. In step 30, another example of array 306 is created, i.e., the second reproducible array. As before in step 22, the second reproducible array may be a digital array having one or more dimensions, with nodes populated by byte values. The second reproducible array may again be reproducible based on predetermined criteria. For example, the second reproducible array may be a three-dimensional array comprised of nodes, with X, Y, and Z coordinates identifying any given node of the second reproducible array.

Each node of the second reproducible array may be configured as a storage location for a byte value. However, unlike the first reproducible array of step 22, each node of the second reproducible array may be populated only with the possible values used to represent commands. Continuing with the previous example, each node of the second reproducible array may accordingly be populated with a value from 0 to 36. The second reproducible array may be sized sufficiently to allow more than one occurrence of any given byte value. For example, the second reproducible array may be approximately the same size as the first reproducible array.

FIG. 12 shows an example of a second reproducible array 322, which is depicted as a cube of data having nodes 324 populated with byte values representing commands.

Methods described in step 22 for populating the array, such as load-and-shuffle or pseudorandom generation, may also be used in step 30. However, in step 30 only command byte values may be used. The frequency distribution of byte values in the second reproducible array (such as array 322) may also be tailored to substantially correspond to a frequency distribution of byte values expected from command representations. For example, grab commands corresponding to longer traversals may be less commonly encountered and therefore may be represented less often in the second reproducible array.

Returning to FIG. 5, step 32 may include identifying a second pattern or pathway in the second reproducible array. Similar to step 24, the second pathway may be an example of a pathway 308 and may be any suitable pattern of locations within the second reproducible array that, if traversed in a predetermined order, may produce a series of values equivalent to those of a given set of bytes. In step 24, that given set of bytes was a subset of data bytes 310. In step 32, the input set of bytes to be matched may be the command representation formed in step 26.

Command representation 508 is shown in FIG. 10, but the set of bytes used in step 32 may include an entire string or series of such command representations. For example, Phase One steps 20-26 may be repeated for a predetermined amount of data or for all of the data bytes 310 in a given input file or stream. This may result in several command representations 318, each representing a different portion of the data bytes 310. The plurality of command representations 318 thus created may be concatenated or combined to be used as the input bytes for step 32. In order to simplify discussion, the example of command representation 508 will be used, keeping in mind that the actual amount of data employed as an input to step 32 may be significantly larger and include a plurality of command representations.

As before, second pathway 326 may be an example of a contiguous pathway in which each subsequent node 324 in pathway 326 has coordinates that differ by no more than one unit for any given dimension relative to the preceding node. In some embodiments, second pathway 326 may be a geometric pattern or may be based on a predetermined mathematical formula. Second pathway 326 may be identified by any suitable method, as explained in step 24, including finding several candidate pathways within array 322, and choosing a single best (or adequate) pathway 326 from among the candidates.

However, in Phase Two, array 322 may be configured to have a much greater probability of containing pattern matches for sequences of values from the series of command representations 318. As explained above, there may only be 36 possible byte values corresponding to commands, and in any case the number of possible values will be less than or equal to the number of possible values for data bytes 310. This reduction in possible values, combined with a sufficiently large array size for array 322 results in a greater duplication of values in nodes 324 and a correspondingly greater probability that any given pattern of values will exist in the array as compared to array 312. In some embodiments, array 322 may be approximately the same size as array 312. However, the same effect may be accomplished using other sizes. In some embodiments, the number of possible command byte values and the number of possible data byte values may be sufficiently similar that the greater duplication of values may be substantially accomplished using a larger array size alone. In any event, with more potential candidates to find and choose from, a greater amount of data compression may be expected from Phase Two than from Phase One.

Again referring back to FIG. 5, step 34 may correspond to step 26 of Phase One, and as before it may overlap with the previous step. In step 34, a command representation may be created for each of the candidates vying to become a second pathway. Although the pathways themselves contain byte values corresponding to commands, commands nonetheless may still be used to encode patterns or pathways in an array 306. Thus, methods and commands identical or similar to those in step 26 may be used to encode and choose a second pathway.

FIG. 13 depicts various candidate pathways that may be found continuing with the example of FIGS. 11 and 12. In this example, five candidates are shown, with candidate pathways 602, 604, 606, and 610 having a size of 4 and candidate pathway 608 having a size of 2. More or fewer candidates may be found. In this example, largest candidate pathways 602, 604, 606, and 610 may be selected for further analysis. FIG. 14 shows these candidates separated into individual pathways.

Figure 15:
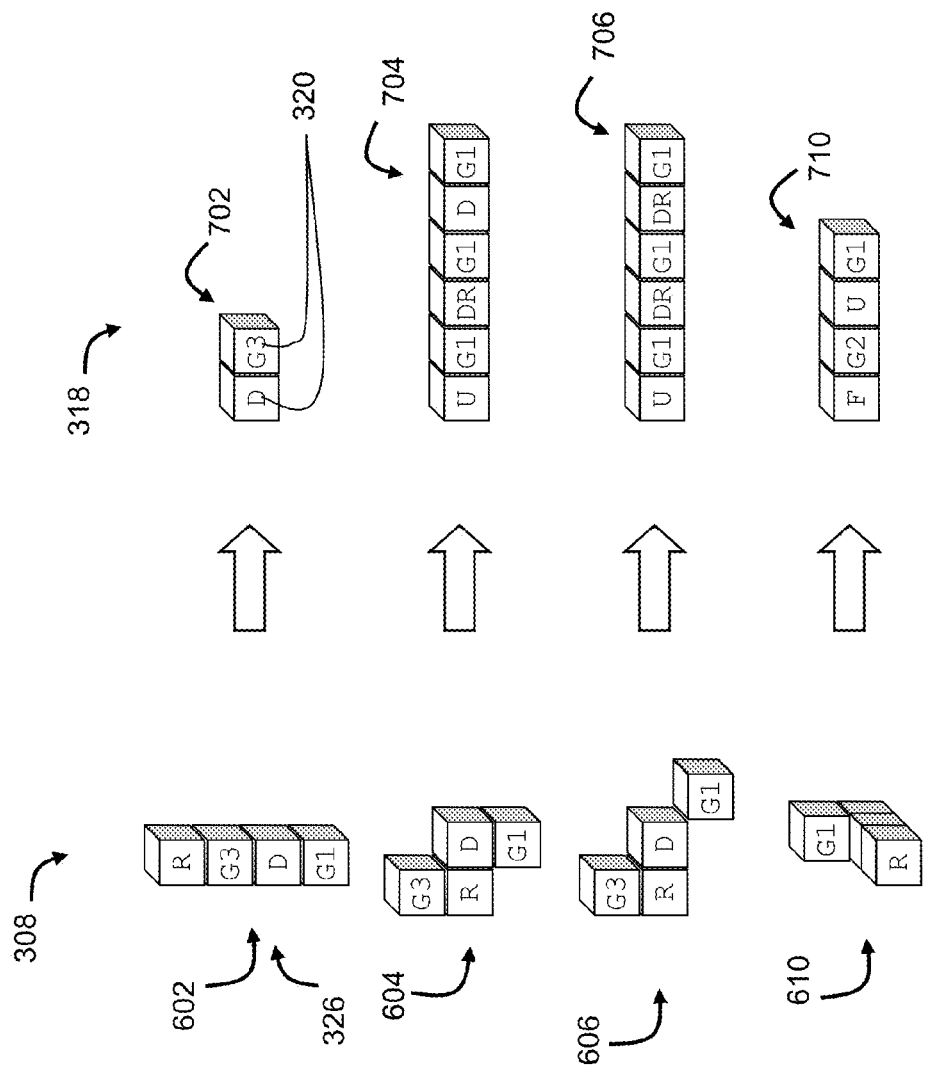
FIG. 15 depicts illustrative command representations of the examples in FIG. 14.

As shown in FIG. 15, respective command representations 702, 704, 706, and 710 may be created for the candidate pathways using the same rubric as in step 26. In this example, command representation 702 has the smallest size and indicates that candidate pathway 602 may be chosen as second pathway 326.

As with Phase One, the steps of Phase Two may be repeated until all or a predetermined amount of the set of Phase One command representations 318 are again encoded. In some embodiments, Phase Two may then be begun yet again, attempting to further reduce the overall size of the set of command representations 318. Phase Two may continue to be repeated until further reduction is no longer possible or practicable. Phase Two may be repeated for only a subset of the command representations 318. For example, certain sections of the data may be more conducive to size reduction using the steps of Phase Two, while other sections have reached maximum practical or desired compression.

Once a desired level of data compression is reached, Phase Two may be completed and a set of output bytes may be created. In some embodiments, the set of final command representations 318 may be further compressed in a post-processing step using a refactoring method. The refactoring method may take advantage of the fact that the command representations 318 consist of a smaller number of possible values than are able to be stored in an eight-bit byte. For example, there may be 36 possible byte values corresponding to commands, whereas an eight-bit byte may store up to 256 possible values.

Continuing with this example, a string of command representations 318 ("command string") in which each byte contains a value from 0 to 35 may be reversibly converted to a shorter (i.e., compressed) string of refactored representations ("refactored string") in which each byte contains a value from 0 to 255. With these parameters, conversion of a command string of nine bytes may be converted to a refactored string of six bytes, resulting in a compression ratio of approximately 66.7%.

The refactoring compression may be accomplished by initially multiplying each value in the command string by a predetermined corresponding factor of 36 and then summing the products. For example, if the nine values in the command string are represented by the letters A, B, C, D, E, F, G, H, and I, then the initial step may be configured to produce a result $R=(A\times36^8)+(B\times36^7)+(C\times36^6)+(D\times36^5)+(E\times36^4)+(F\times36^3)+(G\times36^2)+(H\times36^1)+(I\times36^0)$.

The result R may then be factored in a second step using factors of 256 to produce six values. For example, the result R may first be divided by $256^5$ to determine a first integer value J. The remainder, which is the modulus of R and $256^5$, may then be divided by $256^4$ to determine a second integer value K. The remainder of that operation, in turn may be divided by $256^3$ to determine a third integer value L, and so on through $256^2$, $256^1$, and $256^0$ to determine values M, N, and O. At that point, the nine 0-35 values A, B, C, D, E, F, G, H, and I may be converted to six 0-255 values J, K, L, M, N, and O. Because every value in this example is represented by eight-bit bytes, this conversion results in data compression and a smaller output size.

The six values of the refactored string may be converted back to the nine values of the command string by simply reversing the mathematical steps. In other words, the result R may be determined and then refactored as before, but reversing the order of the factors used. First, R may be re-obtained by multiplying the six refactored values by factors of 256 and summing. Continuing with the previous example, $R=(J\times256^5)+(K\times256^4)+(L\times256^3)+(M\times256^2)+(N\times256^1)+(O\times256^0)$. Because this value of R is the same as the previous value of R obtained in the initial step, it can be factored by factors of 36 to obtain the original nine command values. In other words, dividing R by $36^8$ gives the integer value of A, dividing the remainder of that operation by $36^7$ gives the integer value of B, and so on, until all nine values may again be determined.

In some embodiments, the set of final command representations 318 may be refactored as described above in sequential nine-byte chunks, converting each chunk to six-bytes and creating a shorter overall sequence of values. In other embodiments, more or fewer bytes may be operated on at one time.

It will also be appreciated by a person of ordinary skill that using command strings of different lengths or containing more or fewer than 36 possible values will result in a need to use correspondingly different factoring parameters. In any case, the refactoring method and parameters may be predetermined and coded into a set of compression and/or decompression computer instructions. It should also be appreciated that this refactoring compression method may be incorporated at any point in the process where a set of bytes is certain to contain only a reduced number of possible values, such as 0-35, but where those values are stored in bytes having a capacity for more possible values, such as eight-bit bytes with possible values from 0-255.

Output bytes may be an example of second set of bytes 304, and may be a combination of final command representations 318, including pathway starting location information and the commands for recreating the pathways 308 (which may have been further compressed using the previously described refactoring method), and other bytes representing information such as frequency distribution tailoring settings and number of Phase Two repetitions completed. Output bytes may be described as an encoded, compressed version of data bytes 310, and may contain all the information required to recreate data bytes 310 using the reproducible commands and arrays of method 300.

A digital file or stream containing the output bytes may be transferred to another location using typical methods such as portable storage media or via a network, as shown in FIG. 1. The arrays and command structures of method 300 do not need to be transferred along with the output bytes, resulting in a smaller file transfer size.

In addition to or instead of encryption and compression, the methods and systems of the present disclosure may be used to decrypt and decompress the output bytes. For example, a processor may follow instructions to read output bytes and translate the byte values into starting locations and commands for recreating patterns or pathways 308 in array 322. Essentially performing the steps of Phase Two out of order, array 322 may be produced, using a standard frequency distribution or following other embedded instructions to create a custom distribution. If a post-processing step was used to refactor the data, that step may be reversed as described above. Each pathway 308 may then be retraced or sequentially traversed by following the listed commands. Byte values encountered at each node 324 may be read to determine the set of command representations 318 that were encoded. For example, the commands of command representation 702 may be followed to retrace second pathway 326 in array 322.

Phase Two steps may be repeated for the prescribed number of repetitions listed in the output bytes, resulting in the original set of command representations 318 created by Phase One. At that point, Phase One steps may be carried out. First array 312 would be reproduced and tailored if necessary. Each pathway 308 may then be retraced in first array 312, and the original data bytes 310 may be recreated by reading the byte values encountered at each node 314 on the pathways. For example, the commands of command representation 508 may be followed in order to retrace first pathway 316 in array 312. One skilled in the art will appreciate that each step of this process may have tailored and customized settings, which would be either predetermined or dynamically established during the encryption and compression process.

As may be seen from the description above, no information is eliminated or lost in either the compression or the decompression of data bytes 310. The sequence and value of every byte in data bytes 310 is maintained. As such, method 300 may be considered a lossless compression method.

In some embodiments, the steps of providing a reproducible array, such as steps 22 and 30, may include providing multiple alternate versions of a reproducible array. Multiple alternate versions of a reproducible array may be reproducible and may contain a different set of values in the alternate nodes in order to be useful to the process.

In these embodiments, candidate pathways may be located in one or more arrays. For example, a pathway may start in one array and finish in an alternate version of that array. In another example, one pathway may be in one array and the following pathway may be in an alternate version of that array, with the next pathway after that back in the first array. This may be encoded by either the starting location of each path, by directional commands, or both.

Alternate versions of arrays may also be implemented using four dimensional arrays, with the first three dimensions identifying X, Y, and Z coordinates of a cube and the fourth dimension identifying to which cube the coordinates apply. In some embodiments, more than one byte value may be loaded in a given node of an array. Commands may then be implemented to prescribe which value is to be read for any given step. In some embodiments, instead of multiple alternate values being stored in a given node, strings of two or more values may be stored. This may be useful, for example, if common strings are expected. Rather than requiring two nodes, with corresponding move and grab commands, these strings could be accessed by reaching a single node. These string-storing nodes may be used in conjunction with byte-value storing nodes within a single array.

In some embodiments, a set of input bytes may be a discrete digital file. For example, a digital file may include image files, office document files, html document files, executable files, and the like. In some embodiments, a set of input bytes may be a stream of data, or a subset of a file or of a stream of data. Any set of input bytes may be analyzed prior to compression, in order to determine optimal processing. For example, in some embodiments, a set of input bytes may be analyzed to determine a frequency distribution as explained above. In other embodiments, a set of input bytes may be analyzed to determine whether and how to deconstruct the set into smaller blocks of data or subsets of data to be individually compressed in a certain order. In these embodiments, for example, certain parts of the input data may share certain characteristics. These characteristics may lend themselves to being compressed using a first array that is loaded with a certain distribution of values. Other parts of the input data may have different characteristics indicating use of an array or arrays having a different distribution of values loaded into the nodes of the array. Accordingly, a set of input bytes may be deconstructed into smaller subsets, and each subset may be compressed using a tailored first array and/or second array. In these embodiments, a key or set of instructions describing how to reconstruct the individual subsets or blocks may be generated and provided along with the compressed output file.

Figure 16:
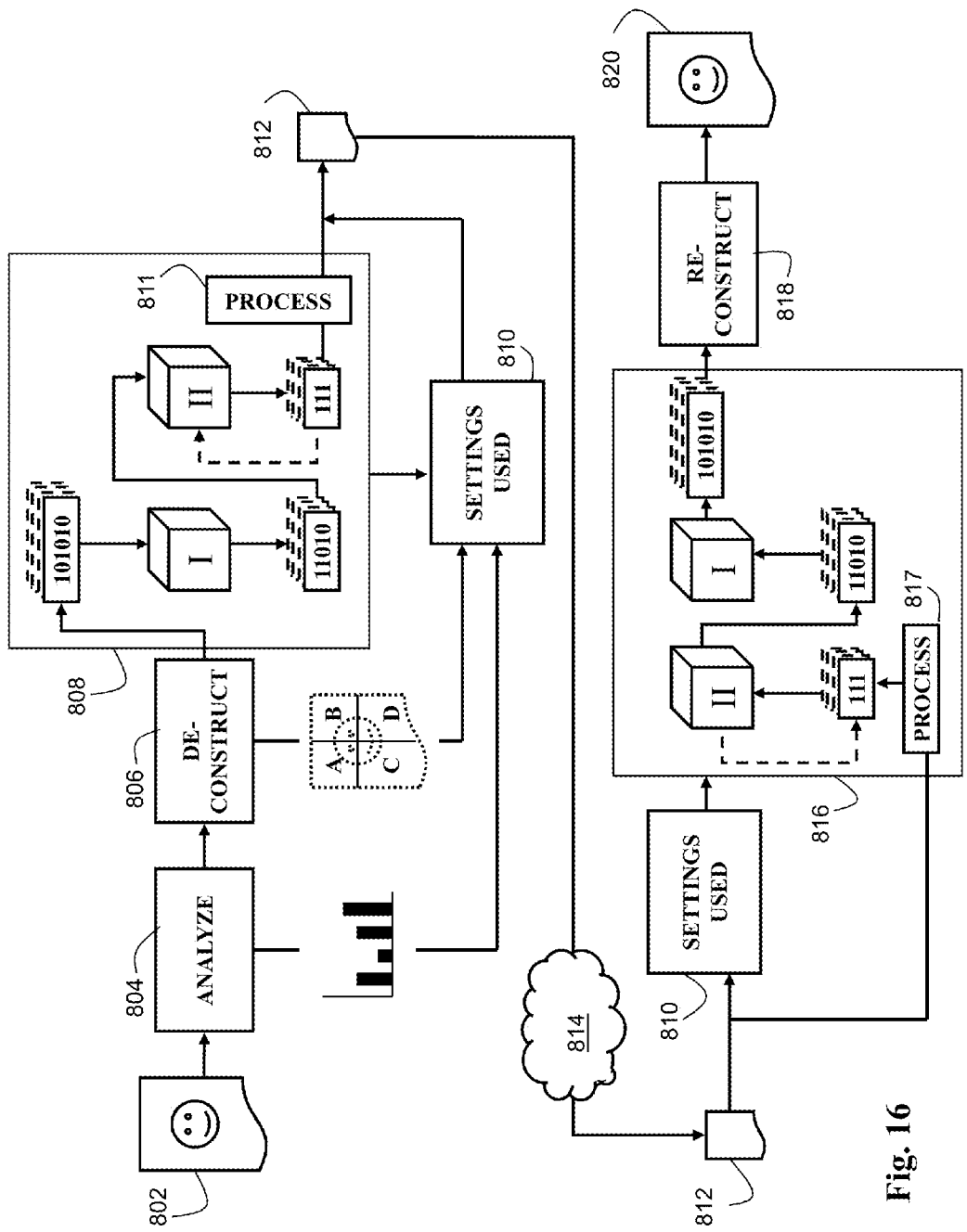
FIG. 16 depicts an illustrative method according to the present disclosure.

FIG. 16 depicts an overall view of an embodiment implemented according to the present disclosure. In this illustrative embodiment, a digital image file 802 is compressed and then decompressed. Here, digital image file 802 may first be analyzed as indicated at 804. A result of this analysis may be to create a histogram or frequency distribution of the various byte values in the file. Another result may be to determine various blocks of data in the file that may share certain characteristics. For example, analysis may show that certain areas of the image file have a greater probability of being a certain shade of blue, while others are more likely to be white. Accordingly, each identified area or block of data may have its own histogram.

Input image file 802 may be deconstructed at 806 based on results of the previous analysis, such that each area may be separated for customized processing or for processing in a certain order. In the example shown, the input file 802 may be divided into four quadrants, labeled A, B, C, and D. Digital data from each quadrant may then be fed into process 808.

Process 808 corresponds to the steps previously described for Phase One and Phase Two, as well as the refactoring compression process. Generally speaking, in Phase One the data for a given quadrant may first be translated into contiguous pathways found in a reproducible first array. The first array may contain values that are distributed similarly to the distribution in the quadrant. The resulting pathways may then be translated into commands and encoded as another set of data. This set of data may then be passed into Phase Two and further translated into contiguous pathways in a reproducible second array. The second array may contain only values corresponding to commands. As indicated in FIG. 16, all or portions of the first phase and/or the second phase may be repeated a predetermined number of times, until a desired compression is achieved, or until no further compression is possible. Further compression may be accomplished using the refactoring process described above and indicated at 811 in FIG. 16.

One or more settings 810 used in Phase One and Phase Two may include whether and which frequency distributions were used, deconstruction instructions, and/or number of iterations completed. These settings, along with file identification information and the final output of Phase Two may be included in a compressed output file 812. At this point, file 812 may be smaller in size than input file 802, and may be transferred to another location.

Transfer of file 812 may be physical, such as on transportable media. For example, compressed file 812 may be stored on a portable flash drive or CD-ROM or any other similar media. In some embodiments, compressed file 812 may instead be transported through a network 814, such as an intranet or the Internet, to a second location. Compressed file 812 or a copy of compressed file 812 may then be decompressed to restore the original file 802 in its original state.

As shown in FIG. 16, decompression may be accomplished by separating the command representations from the settings, and providing those to process 816. This process again corresponds to steps previously described. If refactoring compression process 811 was performed, a corresponding refactoring decompression process 817 may be completed to recreate the set of command representations. The second array may be reproduced and used to translate the command representations into other command representations. This may be repeated as prescribed in the settings. Once a final set of Phase Two command representations is obtained, the reproduced first array may be used to retrace the pathways and translate the commands into the original data.

The settings may again be consulted to determine how the original data should be reconstructed, as indicated at 818. After reconstructing the translated and decompressed data, a lossless copy 820 of the original image file 802 may be produced.

As should be appreciated, the preceding embodiment(s) is/are for illustrative purposes only. In embodiments, steps may be added or removed, and many steps may be performed at least partly in parallel. Different portions of a digital file, or different related digital files may be processed at the same time or prioritized for speed or transfer purposes. Processes such as searching for multiple patterns within arrays may be performed effectively or actually simultaneously. For example some or all processes may be threaded, using a single processor or multiple processors.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the disclosure has been presented for purposes of illustration and description, but is not intended to be exhaustive or limited to the embodiments in the form disclosed. Many modifications and variations will be apparent to those of ordinary skill in the art without departing from the scope and spirit of the embodiments of the disclosure. The embodiments were chosen and described in order to best explain the principles of the disclosure and the practical application, and to enable others of ordinary skill in the art to understand the disclosure for various embodiments with various modifications as are suited to the particular use contemplated.

The disclosure can take the form of an entirely hardware embodiment, an entirely software embodiment or an embodiment containing both hardware and software elements. In an embodiment, the disclosure may be implemented in software, which includes but is not limited to firmware, resident software, microcode, etc. Furthermore, the disclosure can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, and pointing devices) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

We claim:

1. A method, implemented in a computer system, the method comprising:
   reading a first set of data byte values;
   providing a reproducible first array that includes at least one of each data byte value in the first set;
   identifying in the first array a first contiguous pathway that defines a set of data byte values matching the first set;
   creating a second set of command byte values representing the first contiguous pathway;
   providing a reproducible second array that includes at least one of each command byte value in the second set;
   identifying in the second array a second contiguous pathway that defines a set of command byte values matching the second set; and
   creating a third set of command byte values representing the second contiguous pathway.

2. The method of claim 1, wherein
   reading a first set of data byte values includes reading a first set of data bytes each having a first number of possible values;
   providing a reproducible first array and providing a reproducible second array includes providing a first array and second array having approximately the same size; and
   creating a second set of command byte values includes creating a second set of command bytes each having a second number of possible values less than the first number of possible values.

3. The method of claim 2, wherein
   reading a first set of data byte values includes reading a first set of data bytes each having 256 possible values; and
   creating a second set of command byte values includes creating a second set of command bytes each having 36 possible values.

4. The method of claim 1, wherein identifying at least one of the first and second contiguous pathways includes comparing command byte value representations of multiple candidate pathways and selecting a pathway based on criteria including size of representation.

5. The method of claim 1, wherein identifying at least one of the first and second contiguous pathways includes comparing multiple candidate pathways and selecting a pathway based on criteria including size of pathway.

6. The method of claim 1, wherein providing at least one of the first and second reproducible arrays includes providing multiple reproducible alternate versions of the array.

7. The method of claim 1, wherein representing at least one of the first and second contiguous pathways includes providing array coordinates indicating a starting location of the pathway.

8. The method of claim 1, further comprising reading the third set of command byte values;

recreating the second set of command byte values by interpreting the command byte values in the third set to retrace the pathway through the reproducible second array; and recreating the first set of data byte values by interpreting the command byte values in the second set to retrace the pathway through the reproducible first array.

9. The method of claim 1, wherein providing a reproducible first array includes providing a first array having at least one of every possible data byte value.

10. The method of claim 1, wherein providing a reproducible first array includes providing a first array having a distribution of data byte values substantially corresponding to a distribution of data byte values in the first set of data byte values.

11. The method of claim 1, wherein at least one reproducible array includes a plurality of nodes, and at least one node is associated with more than one byte value.

12. The method of claim 1, further comprising causing the third set of command byte values to be transferred from a first location to a second location.

13. A computer system for manipulating data, comprising:
a processor;
a memory; and
a data manipulation program including a plurality of instructions stored in the memory that are executed by the processor to:
read a first set of input byte values;
match a chosen first portion of the first set of input byte values to a chosen first pattern found in a first reproducible array of byte values;
represent the first pattern using corresponding first command byte values indicating one or more commands to recreate the first pattern; and
create a second set of byte values including the command byte values that represent the first pattern;
wherein the first portion and first pattern are chosen from respective multiple candidate portions and patterns based on preselected criteria biased toward candidate portions having a greater size and candidate patterns having a smaller corresponding set of command byte values.

14. The system of claim 13, wherein the plurality of instructions stored in the memory are further executed by the processor to:
read the second set of byte values;
match a chosen second portion of the second set of byte values to a chosen second pattern found in a second reproducible array of byte values;
represent the second pattern using corresponding second command byte values indicating one or more commands to recreate the second pattern; and
create a third set of output byte values including the command byte values that represent the second pattern;
wherein the second portion and second pattern are chosen from respective multiple candidate portions and patterns based on preselected criteria biased toward candidate portions having a greater size and candidate patterns having a smaller corresponding set of command byte values.

15. The system of claim 14,
wherein each input byte has a predetermined first number of possible values, each command byte has a predetermined second number of values, and the first number is greater than the second number; and
wherein the first reproducible array and the second reproducible array are approximately the same size.

16. The method of claim 14, further comprising causing the second set of command byte values to be transferred from a first location to a second location.

17. The method of claim 14, wherein at least one reproducible array includes a plurality of nodes, and at least one node is associated with more than one byte value.

18. A computer program product for manipulating data, the computer program product comprising a computer-readable storage medium having computer-readable program code embodied therewith, the computer readable program code configured to:
losslessly translate between a first set of bytes and a plurality of pathways in a reproducible array of byte values; and
losslessly translate between the plurality of pathways in the reproducible array of byte values and a second set of bytes;
wherein each byte in the first set has a first number of possible values, each byte in the second set has a second number of possible values, and the first number is less than or equal to the second number.

19. The computer program product of claim 18, wherein translating between the plurality of pathways and the second set of bytes includes:
dividing the second set of bytes into portions;
for each portion, finding a plurality of matching pathways in the reproducible array of byte values, assigning a corresponding sequence of commands to recreate each matching pathway, and choosing one of the matching pathways based on preselected criteria including a length of the corresponding sequence of commands.

20. The computer program product of claim 18, wherein translating between the first set of bytes and the plurality of pathways includes:
providing the reproducible array;
reading values of the first set of bytes;
translating the values into commands;
carrying out the commands to recreate the plurality of pathways in the reproducible array.

21. The computer program product of claim 20, wherein translating between the plurality of pathways and the second set of bytes includes:
sequentially traversing the plurality of pathways in the reproducible array, and
reading byte values encountered on each pathway.

* * * * *